(12) United States Patent
Saito

(10) Patent No.: US 9,082,592 B2
(45) Date of Patent: Jul. 14, 2015

(54) PLASMA PROCESSING APPARATUS AND PROCESSING GAS SUPPLY STRUCTURE THEREOF

(75) Inventor: Masashi Saito, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1007 days.

(21) Appl. No.: 13/159,585

(22) Filed: Jun. 14, 2011

(65) Prior Publication Data

US 2011/0303362 A1    Dec. 15, 2011

Related U.S. Application Data

(60) Provisional application No. 61/357,770, filed on Jun. 23, 2010.

(30) Foreign Application Priority Data

Jun. 15, 2010    (JP) .................................. 2010-135704

(51) Int. Cl.
| | |
|---|---|
| C23F 1/08 | (2006.01) |
| C23C 16/455 | (2006.01) |
| H01J 37/32 | (2006.01) |
| H01L 21/67 | (2006.01) |

(52) U.S. Cl.
CPC ....... *H01J 37/3244* (2013.01); *C23C 16/45563* (2013.01); *H01J 37/321* (2013.01); *H01J 37/32449* (2013.01); *H01L 21/67069* (2013.01)

(58) Field of Classification Search
CPC .. C23C 16/45561; C23C 16/45563–16/45591; H01L 21/67069; H01J 37/321; H01J 37/3244; H01J 37/32449

USPC ............. 118/715, 723 I, 723 IR; 156/345.33, 156/345.48
See application file for complete search history.

(56) References Cited

U.S. PATENT DOCUMENTS

| | | | | |
|---|---|---|---|---|
| 6,229,264 | B1 * | 5/2001 | Ni et al. ..................... | 315/111.51 |
| 6,590,186 | B2 * | 7/2003 | Tanaka et al. ................. | 219/390 |
| 6,872,421 | B2 * | 3/2005 | Hwang et al. ............... | 427/248.1 |
| 7,887,670 | B2 * | 2/2011 | Koizumi et al. ......... | 156/345.34 |
| 8,062,472 | B2 * | 11/2011 | Liu et al. ................... | 156/345.48 |
| 8,551,289 | B2 * | 10/2013 | Nishimura et al. ...... | 156/345.48 |
| 2003/0192645 | A1 * | 10/2003 | Liu et al. ................... | 156/345.33 |

FOREIGN PATENT DOCUMENTS

JP    2000-248364 A    9/2000

* cited by examiner

*Primary Examiner* — Jeffrie R Lund
*Assistant Examiner* — Benjamin Kendall
(74) *Attorney, Agent, or Firm* — Pearne & Gordon LLP

(57) ABSTRACT

There is provided a plasma processing apparatus for performing a plasma process on a substrate mounted on a mounting table in a processing chamber by generating inductively coupled plasma within the processing chamber by applying a high frequency power to a high frequency antenna. The apparatus includes a multiple number of gas nozzles protruding from a sidewall of the processing chamber toward a center of the processing chamber in a space above the mounting table, and each gas nozzle has a gas discharge hole at a leading end of the gas nozzle in a protruding direction and a gas discharge hole at a sidewall of the gas nozzle. Further, the apparatus includes a rotation device configured to rotate each of the gas nozzles on each central axis of the gas nozzles and each central axis is extended in the protruding direction of each of the gas nozzles.

5 Claims, 3 Drawing Sheets

PLASMA PROCESSING APPARATUS AND PROCESSING GAS SUPPLY STRUCTURE THEREOF

CROSS-REFERENCE TO RELATED APPLICATION

This application claims the benefit of Japanese Patent Application No. 2010-135704 filed on Jun. 15, 2010 and U.S. Provisional Application Ser. No. 61/357,770 filed on Jun. 23, 2010, the entire disclosures of which are incorporated herein by reference.

FIELD OF THE INVENTION

The present disclosure relates to a plasma processing apparatus and a processing gas supply structure thereof.

BACKGROUND OF THE INVENTION

Conventionally, in the field of manufacture of a semiconductor device or the like, a plasma processing apparatus using inductively coupled plasma (ICP) has been known as an apparatus for performing, e.g., a film forming process or an etching process on a substrate such as a semiconductor wafer.

As a processing gas supply structure of the plasma processing apparatus using ICP, there is known a processing gas supply structure having a ring disposed in a processing chamber and provided with a multiple number of nozzles along the circumference of the ring, and supplying a processing gas while discharge positions of the nozzles toward the substrate are varied by rotating the ring in opposite directions alternately (see, for example, Patent Document 1).

Patent Document 1: Japanese Patent Laid-open Publication No. 2000-248364

In the plasma processing apparatus using ICP, the processing gas supply structure needs to be installed so as not to block an electromagnetic field induced from a high frequency antenna provided outside the processing chamber. Thus, basically, positions for discharging the processing gas have been limited to those corresponding to a central portion and a periphery of the substrate. In such a case, however, a processing gas cannot be properly supplied to meet a required processing performance.

BRIEF SUMMARY OF THE INVENTION

In view of the foregoing, the present disclosure provides a plasma processing apparatus and a processing gas supply structure thereof capable of properly supplying a processing gas to meet a required processing performance.

In accordance with one aspect of the present disclosure, there is provided a plasma processing apparatus for performing a plasma process on a substrate mounted on a mounting table in a processing chamber by generating inductively coupled plasma within the processing chamber by applying a high frequency power to a high frequency antenna. The plasma processing apparatus includes a multiple number of gas nozzles protruding from a sidewall of the processing chamber toward a center of the processing chamber in a space above the mounting table and each gas nozzle has a gas discharge hole at a leading end of the gas nozzle in a protruding direction and a gas discharge hole at a sidewall of the gas nozzle. Further, the plasma processing apparatus includes a rotation device configured to rotate each of the gas nozzles on each central axis of the gas nozzles and each central axis is extended in the protruding direction of each of the gas nozzles.

In accordance with another aspect of the present disclosure, there is provided a processing gas supply structure of a plasma processing apparatus for performing a plasma process on a substrate mounted on a mounting table in a processing chamber by generating inductively coupled plasma within the processing chamber by applying a high frequency power to a high frequency antenna. The processing gas supply structure includes a multiple number of gas nozzles protruding from a sidewall of the processing chamber toward a center of the processing chamber in a space above the mounting table and each gas nozzle has a gas discharge hole at a leading end of the gas nozzle in a protruding direction and a gas discharge hole at a sidewall of the gas nozzle. Further, the processing gas supply structure includes a rotation device configured to rotate each of the gas nozzles on each central axis of the gas nozzles and each central axis is extended in the protruding direction of each of the gas nozzles.

In accordance with the present disclosure, there are provided a plasma processing apparatus and a processing gas supply structure thereof capable of properly supplying a processing gas to meet a required processing performance.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

Figure 1:
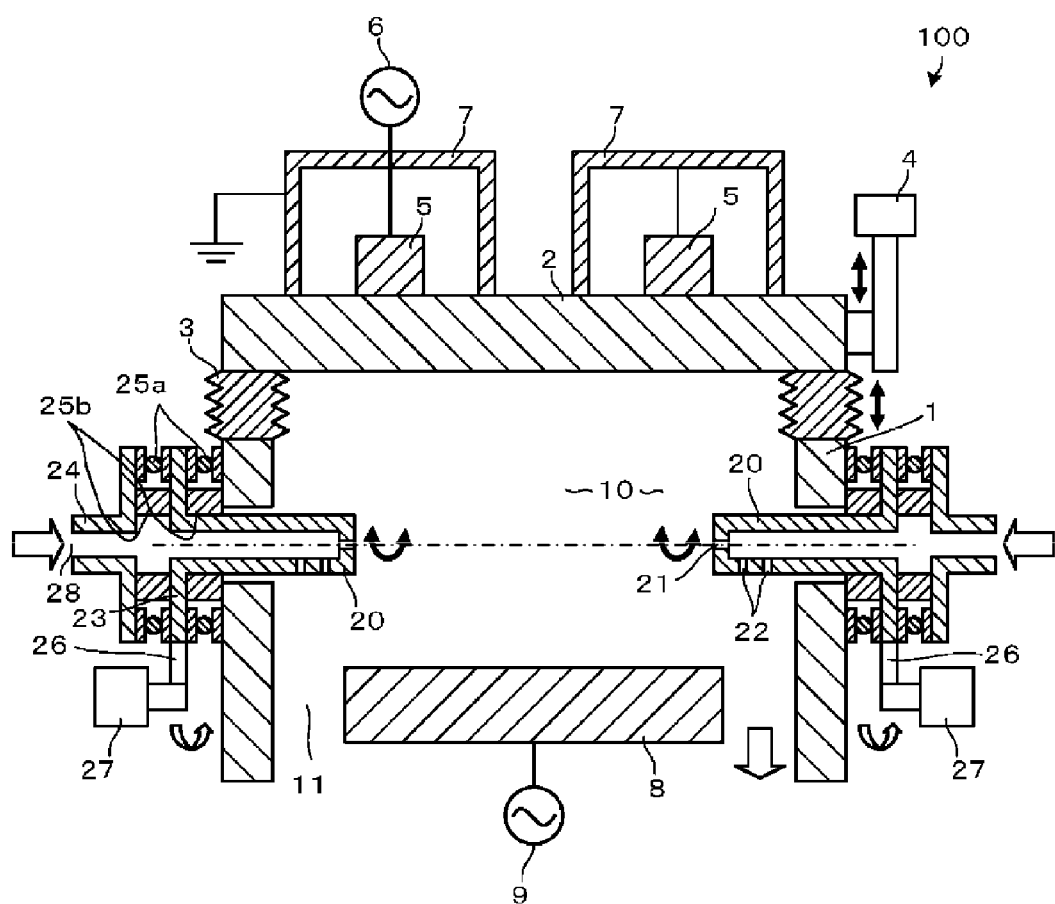
FIG. 1 is a longitudinal cross sectional view schematically showing a configuration of a plasma processing apparatus in accordance with a first embodiment of the present disclosure.

FIG. 1 is a longitudinal cross sectional view schematically illustrating a configuration of a plasma etching apparatus 100 serving as a plasma processing apparatus in accordance with a first embodiment of the present disclosure. As depicted in FIG. 1, the plasma etching apparatus 100 may include a cylindrical processing chamber 1 made of a conductive material, e.g., aluminum of which surface is anodically oxidized. The inside of the processing chamber 1 may be hermetically sealed.

The processing chamber 1 may have a top opening, and a top plate 2 may be provided so as to close the top opening airtightly. At least a part of the top plate 2 is made of a dielectric material such as quartz and serves as a dielectric window.

A bellows 3 is provided between the top plate 2 and the processing chamber 1 so as to hermetically seal a gap between the top plate 2 and the processing chamber 1 while allowing the top plate 2 to be movable up and down with respect to the processing chamber 1. Further, the top plate is connected with a vertical movement driving unit 4 composed of, e.g., a motor. By operating the vertical movement driving unit 4, the top plate 2 can be moved up and down with respect to the processing chamber 1.

A high frequency antenna 5 having, e.g., a circular ring shape is provided on a top surface of the top plate 2. The high frequency antenna 5 is connected with a high frequency power supply 6 configured to supply a high frequency power of a preset frequency. Further, a shield box 7 made of a conductor is provided around the high frequency antenna 5 so as to enclose the high frequency antenna 5, and the shield box 7 is grounded. The shield box 7 may prevent leakage of the high frequency power supplied to the high frequency antenna 5 to the vicinity thereof.

During a plasma process, a high frequency power of a preset frequency, e.g., about 13.56 MHz for generating plasma is supplied to the high frequency antenna 5 from the high frequency power supply 6. As the high frequency power is supplied to the high frequency antenna 5, an inductive electromagnetic field is generated within the processing chamber 1 via the dielectric window of the top plate 2. Then, a processing gas supplied into the processing chamber is excited into plasma by the inductive electromagnetic field.

A mounting table (susceptor) 8 is provided within the processing chamber 1. A substrate such as a semiconductor wafer is mounted on a mounting surface at the top of the mounting table 8 and the plasma process may be performed on the substrate. The mounting table 8 is connected with a high frequency bias power supply 9 configured to supply a bias power of a preset frequency, e.g., about 380 KHz. The high frequency bias power supply 9 is used to attract ions in the excited plasma within the processing chamber 1 toward the semiconductor wafer effectively. Further, although not shown, an electrostatic chuck capable of holding the semiconductor wafer, a temperature control device capable of controlling a temperature of the semiconductor wafer to a preset temperature, and the like are provided at the mounting table 8.

A space above the mounting table 8 within the processing chamber 1 serves as a processing space 10 in which the plasma is generated and the plasma process is performed on the semiconductor wafer. Meanwhile, a ring-shaped gas exhaust space 11 is formed around the mounting table 8. The gas exhaust space 11 is connected with a gas exhaust device (not shown) such as a vacuum pump through a gas exhaust port formed in a bottom of the processing chamber 1. By evacuating the processing chamber 1 by the gas exhaust device, the inside of the processing chamber 1 can be maintained at a preset vacuum level.

A multiple number of gas nozzles 20 are provided at a sidewall of the processing chamber 1. The gas nozzles 20 may protrude toward a center of the processing chamber 1 in the processing space 10 above the semiconductor wafer mounted on the mounting table 8 within the processing chamber 1. The gas nozzles 20 are equi-spaced from each other, i.e., uniformly arranged at a regular distance along the cylindrical sidewall of the processing chamber 1 so as to surround a periphery of the semiconductor wafer mounted on the mounting table 8. Further, although only two gas nozzles 20 are illustrated in FIG. 1, the number of the gas nozzles 20 is not limited. For example, four to eight gas nozzles may be used.

Figure 2:
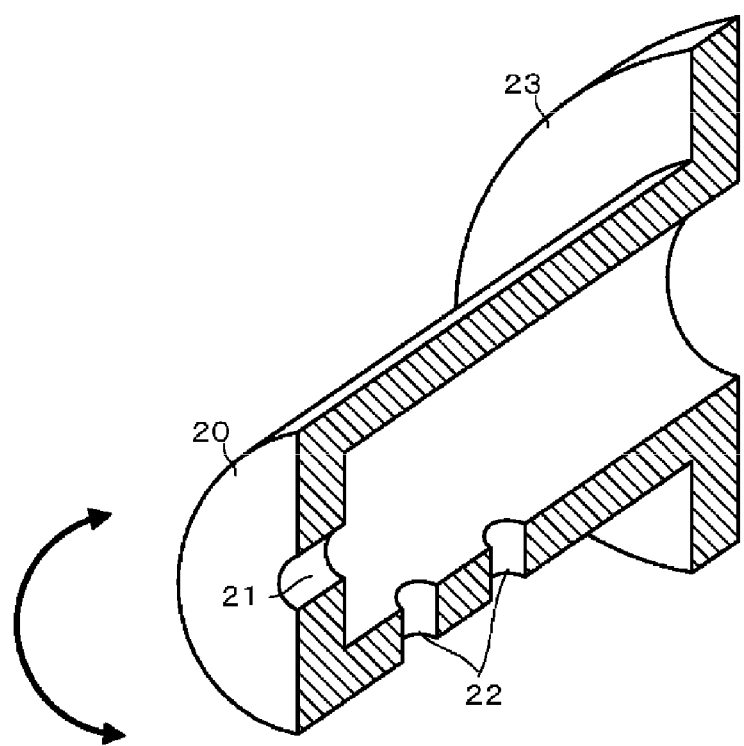
FIG. 2 is a cross sectional view schematically showing a configuration of major parts of the plasma processing apparatus of FIG. 1.

As depicted in FIG. 2, each gas nozzle 20 is formed in a cylinder shape. A gas discharge hole 21 is formed in a central portion of a leading end of the gas nozzle 20, and a multiple number of (two in the example shown in FIGS. 1 and 2) gas discharge holes 22 are also formed in a sidewall of the gas nozzle 20. The number of these gas discharge holes 21 and 22 may not be limited to the examples shown in FIGS. 1 and 2 but can be varied.

A rear end portion of the gas nozzle 20 is located at the outside of the sidewall of the processing chamber 1, and a circular ring-shaped rotation member 23 protruding outward in a flange shape is provided at the rear end portion of the gas nozzle 20. Further, a fixed member 24 secured to the sidewall of the processing chamber 1 is provided at the rear of the rotation member 23. The rotation member 23 is supported between the fixed member 24 and the sidewall of the processing chamber 1.

Bearings 25a are provided between the sidewall of the processing chamber 1 and the rotation member 23 and between the fixed member 24 and the rotation member 23 to rotatably support the rotation member 23. Further, sealing members 25b composed of a ferrofluid seal or the like for airtightly sealing gaps between the sidewall of the processing chamber 1 and the rotation member 23 and between the fixed member 24 and the rotation member 23 are provided. The rotation member 23 is connected with a rotation driving unit 27 composed of a motor or the like via a rotation transmitting member 26 composed of a gear, a belt and so forth. By driving the rotation driving unit 27, the gas nozzle 20 can be rotated on a central axis (indicated by a dashed-dotted line in FIG. 1) thereof. Here, the central axis is extended in a protruding direction of the gas nozzle 20.

A processing gas inlet 28 is formed at a rear end of the fixed member 24. A processing gas (etching gas) is supplied into the processing gas inlet 28 from a non-illustrated processing gas supply source, and the processing gas is then supplied into the processing space 10 within the processing chamber 1 via the gas discharge holes 21 and 22 of the gas nozzle 20.

During the plasma process, the gas nozzles 20 may be rotated on their central axes while supplying the processing gas. At this time, the gas nozzles 20 may be rotated in one direction or rotated in opposite directions alternately. Further, the gas nozzles 20 may be rotated in advance and fixed so as to orient the gas discharge holes 22 provided at the sidewalls thereof to a preset direction. After the positions of the gas nozzles 20 are previously adjusted in this way, the processing gas may be supplied without rotation of the gas nozzles 20. The rotation of the gas nozzles 20 may be controlled depending on a required processing performance. In accordance with the present disclosure, there is provided an additional means for adjusting a supply state of the processing gas as compared to conventional cases, so that a required processing gas supply state may be achieved more successfully.

Now, a plasma etching process to be performed on a semiconductor wafer by the plasma etching apparatus 100 having the above-described configuration will be explained.

First, a non-illustrated opening/closing device such as a gate valve is opened, and the semiconductor wafer is loaded into the processing chamber 1 by a transfer device and mounted on the mounting table 8. Then, the processing chamber 1 is evacuated by the non-illustrated gas exhaust device through the gas exhaust space 11 within the processing chamber. A processing gas (etching gas) is supplied into the processing space 10 within the processing chamber 1 via the gas nozzles 20, and the inside of the processing space 10 is maintained in a certain pressure atmosphere.

Here, as described above, the processing gas is supplied while the gas nozzles 20 are being rotated as required. The gas nozzles 20 may be rotated in one direction or may be rotated in opposite directions alternately. Furthermore, if necessary, the gas discharge holes 22 may be oriented to a preset direction by rotating the gas nozzles 20 in advance and fixing the gas nozzles 20, and during the plasma process, the processing gas may be supplied without rotation of the gas nozzles 20.

Subsequently, a high frequency power having a preset frequency (e.g., about 13.56 MHz) is applied from the high frequency power supply 6 to the high frequency antenna 5, so that an inductive electromagnetic field is generated within the processing space 10 via the dielectric window of the top plate 2. By the inductive electromagnetic field, the processing gas is excited into plasma within the processing space 10, so that high-density inductively coupled plasma is generated. Ions in the generated plasma may be effectively attracted to the semiconductor wafer by a high frequency bias power applied from the high frequency bias power supply 9 to the mounting table 8, so that a plasma etching process is performed on the semiconductor wafer. In this plasma etching process, a supply state of the processing gas can be controlled by using the gas nozzles 20, and, thus, a processing performance required for the plasma etching process can be achieved.

Upon the completion of the plasma process, the supply of the high frequency power and the supply of the processing gas are stopped, and the semiconductor wafer W is unloaded from the processing chamber 1 in the reverse order to that described above.

Figure 3:
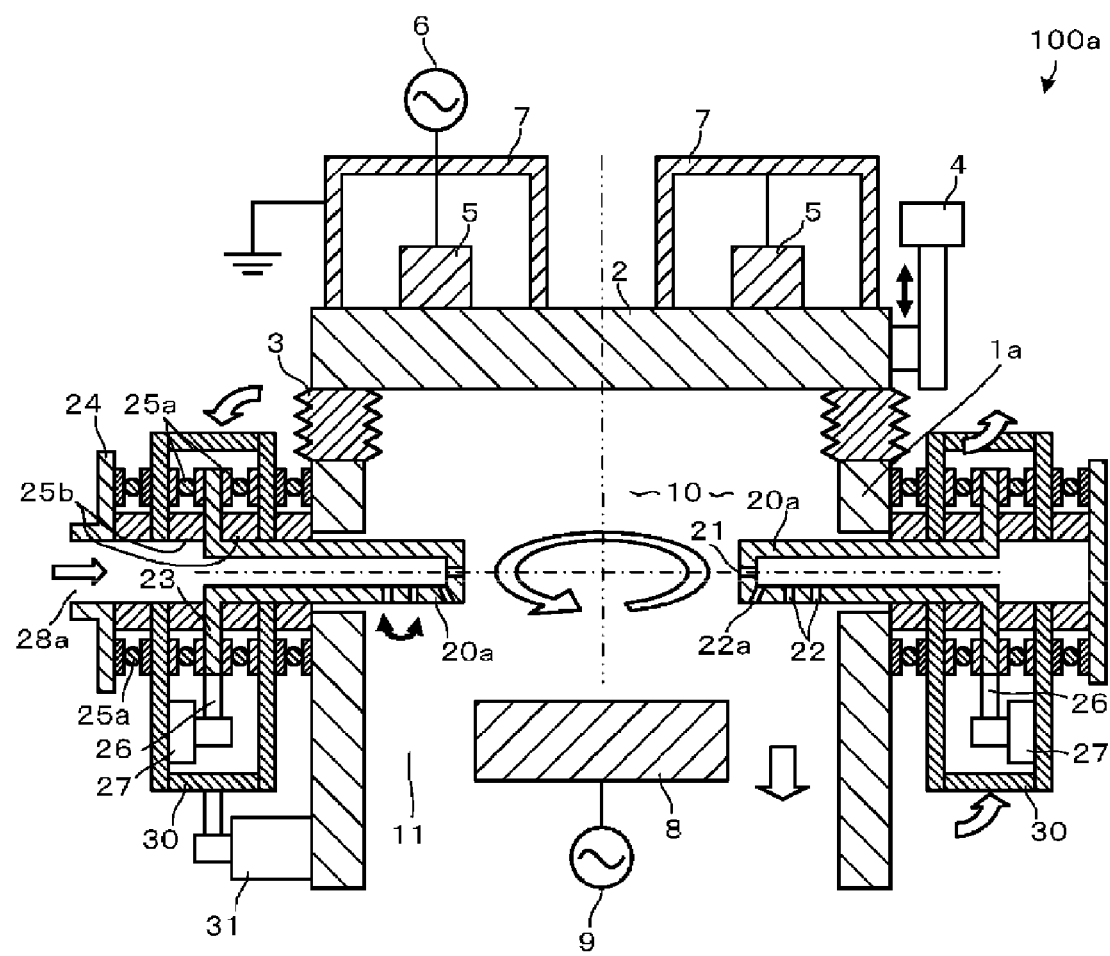
FIG. 3 is a longitudinal cross sectional view schematically showing a configuration of a plasma processing apparatus in accordance with a second embodiment of the present disclosure.

Now, a plasma etching apparatus 100a in accordance with a second embodiment will be explained with reference to FIG. 3. In this plasma etching apparatus 100a, each gas nozzle 20a is secured to a revolution device 30. By driving a revolution driving unit 31 composed of a motor or the like, each gas nozzle 20a revolves (rotates) around a central axis (indicated by a dashed double-dotted line of FIG. 3) of the processing chamber 1a as a revolution axis.

Further, in a sidewall of each gas nozzle 20a, a gas discharge hole 22a inclined toward a front end of the gas nozzle 20a is formed in addition to gas discharge holes 22 formed substantially perpendicular to a sidewall surface of the gas nozzle 20a. Further, a common processing gas inlet 28a may be provided for a multiple number of gas nozzles 20a. In such a case, the processing gas may be supplied into the gas nozzles 20a from the common processing gas inlet 28a. Further, since the other parts of the plasma etching apparatus 100a may be the same as those of the plasma etching apparatus 100, corresponding parts will be assigned same reference numerals, and redundant description thereof will be omitted.

In the plasma etching apparatus 100a having the above-described configuration in accordance with the second embodiment, the same effects as obtained in the plasma etching apparatus 100 in accordance with the first embodiment may be achieved. Moreover, since each gas nozzle 20a revolves around the central axis of the processing chamber 1a as the revolution axis by the revolution device 30 and the revolution driving unit 31, the supply state of the processing gas can be more uniformized along a cylindrical sidewall of the processing chamber 1a by revolution of each gas nozzle 20a during a plasma etching process.

Although the present disclosure has been described with respect to the first and second embodiments, the present disclosure may not be limited to these embodiments but can be modified in various ways.

What is claimed is:

1. A plasma processing apparatus for performing a plasma process on a substrate mounted on a mounting table in a processing chamber by generating inductively coupled plasma within the processing chamber by applying a high frequency power to a high frequency antenna, the apparatus comprising:

a multiple number of gas nozzles protruding from a sidewall of the processing chamber toward a center of the processing chamber in a space above the mounting table, each gas nozzle having a gas discharge hole at a leading end of the gas nozzle in a protruding direction and a gas discharge hole at a sidewall of the gas nozzle;

a rotation device configured to rotate each of the gas nozzles on each central axis of the gas nozzles, each central axis being extended in the protruding direction of each of the gas nozzles; and a revolution device configured to allow the gas nozzles to revolve around a central axis of the processing chamber along a circumference of the processing chamber, wherein the rotation device includes: a rotation member provided at a rear end portion of each of the gas nozzles; and a rotation driving unit connected with the rotation member via a rotation transmitting member, the revolution device is connected with the rotation driving unit at an outside of the processing chamber, while the rotation driving unit is installed within the revolution device, and the revolution device is connected with a revolution driving unit.

2. The plasma processing apparatus of claim 1, wherein the gas nozzles are equi-spaced from each other to surround a periphery of the mounting table.

3. The plasma processing apparatus of claim 1, further comprising:

a top plate covering a top opening of the processing chamber and configured to be movable up and down, wherein the high frequency antenna is provided on a top surface of the top plate.

4. The plasma processing apparatus of claim 2, further comprising:

a top plate covering a top opening of the processing chamber and configured to be movable up and down, wherein the high frequency antenna is provided on a top surface of the top plate.

5. A processing gas supply structure of a plasma processing apparatus for performing a plasma process on a substrate mounted on a mounting table in a processing chamber by generating inductively coupled plasma within the processing chamber by applying a high frequency power to a high frequency antenna, the processing gas supply structure comprising:

a multiple number of gas nozzles protruding from a sidewall of the processing chamber toward a center of the processing chamber in a space above the mounting table, each gas nozzle having a gas discharge hole at a leading end of the gas nozzle in a protruding direction and a gas discharge hole at a sidewall of the gas nozzle;

a rotation device configured to rotate each of the gas nozzles on each central axis of the gas nozzles, each central axis being extended in the protruding direction of each of the gas nozzles; and a revolution device configured to allow the gas nozzles to revolve around a central axis of the processing chamber along a circumference of the processing chamber, wherein the rotation device includes: a rotation member provided at a rear end portion of each of the gas nozzles; and a rotation driving unit connected with the rotation member via a rotation transmitting member, the revolution device is connected with the rotation driving unit at an outside of the processing chamber, while the rotation driving unit is installed within the revolution device, and the revolution device is connected with a revolution driving unit.

\* \* \* \* \*

UNITED STATES PATENT AND TRADEMARK OFFICE
CERTIFICATE OF CORRECTION

PATENT NO. : 9,082,592 B2  
APPLICATION NO. : 13/159585  
DATED : July 14, 2015  
INVENTOR(S) : Masashi Saito Page 1 of 1

It is certified that error appears in the above-identified patent and that said Letters Patent is hereby corrected as shown below:

In the specification,

Column 3, line 2, please add -- 2 -- between "plate" and "is"

Column 3, line 24, please add -- 1 -- between "chamber" and "is"

Signed and Sealed this  
Fifth Day of January, 2016

Michelle K. Lee  
*Director of the United States Patent and Trademark Office*